United States Patent
Ni et al.

(10) Patent No.: US 10,541,713 B2
(45) Date of Patent: Jan. 21, 2020

(54) MULTIPLEXERS HAVING HYBRID CIRCUITS WITH RESONATORS

(71) Applicant: SKYWORKS SOLUTIONS, INC., Woburn, MA (US)

(72) Inventors: Jianxing Ni, San Jose, CA (US); Joshua James Caron, Madison, NC (US); Srivatsan Jayaraman, Santa Clara, CA (US); Reza Kasnavi, Solana Beach, CA (US); John G. Freed, Raleigh, NC (US)

(73) Assignee: Skyworks Solutions, Inc., Woburn, MA (US)

( * ) Notice: Subject to any disclaimer, the term of this patent is extended or adjusted under 35 U.S.C. 154(b) by 285 days.

(21) Appl. No.: 15/196,006

(22) Filed: Jun. 28, 2016

(65) Prior Publication Data
US 2016/0380608 A1    Dec. 29, 2016

Related U.S. Application Data

(60) Provisional application No. 62/186,348, filed on Jun. 29, 2015.

(51) Int. Cl.
*H04B 1/18*    (2006.01)
*H04B 1/00*    (2006.01)
(Continued)

(52) U.S. Cl.
CPC .............. *H04B 1/18* (2013.01); *H03H 7/463* (2013.01); *H03H 9/706* (2013.01); *H03H 9/725* (2013.01); *H04B 1/0057* (2013.01); *H04B 1/3827* (2013.01)

(58) Field of Classification Search
CPC .......... H03H 7/46; H03H 7/463; H03H 7/466; H03H 7/468; H03H 9/70; H03H 9/703;
(Continued)

(56) References Cited

U.S. PATENT DOCUMENTS 5,473,295 A * 12/1995 Turunen ................. H04B 1/50
                                                  333/132
5,717,367 A *  2/1998 Murai ....................... H03H 9/25
                                                  310/313 D
(Continued)

FOREIGN PATENT DOCUMENTS

CN     102811032 A    12/2012
JP     2003-198207 A *  7/2003
(Continued)

OTHER PUBLICATIONS

A. Gopinath; "Maximum Q-Factor of Microstrip Resonators"; IEEE Transactions on Microwave Theory and Techniques, vol. MTT-29, No. 2, Feb. 1981, pp. 128-131.*
(Continued)

*Primary Examiner* — Barbara Summons
(74) *Attorney, Agent, or Firm* — Chang & Hale LLP

(57) ABSTRACT

Multiplexers having hybrid circuits with resonators. In some embodiments, a multiplexer for processing radio-frequency signals can include a plurality of nodes, a common node, and a signal path implemented between each of the plurality of nodes and the common node. Each signal path can include a filter, and each of at least some of the signal paths can further include a resonator coupled with the corresponding filter. A signal path with the resonator provides a sharper notch profile for a radio-frequency signal than a signal path without the resonator.

19 Claims, 12 Drawing Sheets

(51) Int. Cl.
*H03H 7/46* (2006.01)
*H03H 9/70* (2006.01)
*H03H 9/72* (2006.01)
*H04B 1/3827* (2015.01)

(58) Field of Classification Search
CPC .......... H03H 9/706; H03H 9/72; H03H 9/725; H04B 1/0057; H04B 1/18; H04B 1/3827
USPC .................... 333/132, 133; 455/78, 82, 83
See application file for complete search history.

(56) References Cited

U.S. PATENT DOCUMENTS

| | | | | |
|---|---|---|---|---|
| 6,057,744 | A * | 5/2000 | Ikada | H03H 9/0576 333/133 |
| 6,249,687 | B1 * | 6/2001 | Thomsen | H01P 1/213 375/316 |
| 2011/0210805 | A1 * | 9/2011 | Link | H03H 9/547 333/134 |
| 2012/0306591 | A1 * | 12/2012 | Nishihara | H03H 9/173 333/133 |
| 2014/0113580 | A1 * | 4/2014 | Yamazaki | H03H 9/6483 455/307 |
| 2014/0210569 | A1 * | 7/2014 | Tasaka | H03H 7/463 333/133 |
| 2014/0355171 | A1 | 12/2014 | Gupta et al. | |
| 2015/0070107 | A1 * | 3/2015 | Tokuda | H03H 7/0115 333/195 |
| 2015/0295697 | A1 * | 10/2015 | Kawachi | H03H 9/706 370/276 |
| 2017/0093365 | A1 * | 3/2017 | Xu | H03H 7/1741 |

FOREIGN PATENT DOCUMENTS

| | | | |
|---|---|---|---|
| JP | 2005-184143 | A * | 7/2005 |
| JP | 2005-191797 | A * | 7/2005 |
| JP | 2012253497 | A | 12/2012 |
| JP | 2015201808 | A | 11/2015 |
| WO | 2014005061 | A1 | 1/2014 |

OTHER PUBLICATIONS

English language machine translation of JP 2005-184143 A, published Jul. 7, 2005, 9 pages.*

* cited by examiner

MULTIPLEXERS HAVING HYBRID CIRCUITS WITH RESONATORS

CROSS-REFERENCE TO RELATED APPLICATION(S)

This application claims priority to U.S. Provisional Application No. 62/186,348 filed Jun. 29, 2015, entitled MULTIPLEXERS HAVING HYBRID CIRCUITS WITH SAW RESONATORS, the disclosure of which is hereby expressly incorporated by reference herein in its entirety.

BACKGROUND

Field

The present disclosure relates to multiplexers for radio-frequency (RF) applications.

Description of the Related Art

In some radio-frequency (RF) applications such as wireless applications, two or more RF signals can be multiplexed together to allow routing of such signals through a common path. Combining of two RF signals is typically referred to as diplexing; combining of three RF signals is typically referred to as triplexing; and so on.

SUMMARY

According to a number of implementations, the present disclosure relates to a multiplexer for processing radio-frequency signals. The multiplexer includes a plurality of nodes, a common node, and a signal path implemented between each of the plurality of nodes and the common node. Each signal path includes a filter, and each of at least some of the signal paths further includes a resonator coupled with the corresponding filter.

In some embodiments, a signal path with the resonator can provide a sharper notch profile for a radio-frequency signal than a signal path without the resonator. The plurality of nodes can correspond to a plurality of input nodes, and the common node corresponds to an output node. The multiplexer can be, for example, a diplexer such that two input nodes are coupled to the common output node through their respective signal paths, a triplexer such that three input nodes are coupled to the common output node through their respective signal paths, or a quadplexer such that four input nodes are coupled to the common output node through their respective signal paths.

In some embodiments, each of the plurality of signal paths can include a corresponding resonator. In some embodiments, at least one signal path may not include a resonator. The signal paths having the respective resonators are configured to process radio-frequency signals having frequencies that are higher than frequencies of one or more signal paths without resonators.

In some embodiments, the resonator and the filter can be connected in series in the corresponding signal path. The resonator can be implemented upstream of the filter, or downstream of the filter. In some embodiments, the corresponding signal path can further include an additional resonator. Such filter can be implemented, for example, between the two resonators.

In some embodiments, each resonator can have a Q-factor value that is higher than the corresponding filter's Q-factor value. In some embodiments, each filter can be a band-pass filter. Each resonator can be a surface acoustic wave resonator, a bulk acoustic wave resonator, or a resonator having a high Q-factor value.

In some teachings, the present disclosure relates to a method for multiplexing radio-frequency signals. The method includes providing a common path to receive a plurality of radio-frequency signals, and processing the plurality of radio-frequency signals through corresponding signal paths such that each radio-frequency signal is filtered, and such that each of at least some of the radio-frequency signals is also passed through a resonator.

In some embodiments, a radio-frequency signal that has passed through the resonator and the corresponding filter can have a sharper notch profile than a radio-frequency signal that has passed through only a filter.

In a number of implementations, the present disclosure relates to a radio-frequency module that includes a packaging substrate configured to receive a plurality of components, and a multiplexer implemented relative to the packaging substrate. The multiplexer includes a plurality of nodes and a common node, and a signal path implemented between each of the plurality of node and the common node. Each signal path includes a filter, and each of at least some of the signal paths further includes a resonator coupled with the corresponding filter.

In some embodiments, a signal path with the resonator can provide a sharper notch profile for a radio-frequency signal than a signal path without the resonator. In some embodiments, the radio-frequency module can further include a low-noise amplifier coupled to the multiplexer. In some embodiments, an input of the low-noise amplifier can be coupled to the common node of the multiplexer. In some embodiments, the low-noise amplifier can be a broadband low-noise amplifier. In some embodiments, the low-noise amplifier can be implemented specific to a given signal path. In some embodiments, the low-noise amplifier can be downstream of the filter, or upstream of the filter.

In some embodiments, the radio-frequency module can be, for example, a front-end module or a diversity receive module.

In accordance with some implementations, the present disclosure relates to a wireless device that includes a receiver configured to process radio-frequency signals, and a radio-frequency module in communication with the receiver. The radio-frequency module includes a multiplexer having a plurality of nodes and a common node. The multiplexer further includes a signal path implemented between each of the plurality of node and the common node. Each signal path includes a filter, and each of at least some of the signal paths further includes a resonator coupled with the corresponding filter. The wireless device further includes an antenna in communication with the radio-frequency module, and the antenna is configured to receive the radio-frequency signals.

In some embodiments, a signal path with the resonator can provide a sharper notch profile for a radio-frequency signal than a signal path without the resonator.

For purposes of summarizing the disclosure, certain aspects, advantages and novel features of the inventions have been described herein. It is to be understood that not necessarily all such advantages may be achieved in accordance with any particular embodiment of the invention. Thus, the invention may be embodied or carried out in a manner that achieves or optimizes one advantage or group of advantages as taught herein without necessarily achieving other advantages as may be taught or suggested herein.

DETAILED DESCRIPTION OF SOME EMBODIMENTS

The headings provided herein, if any, are for convenience only and do not necessarily affect the scope or meaning of the claimed invention.

Figure 1:
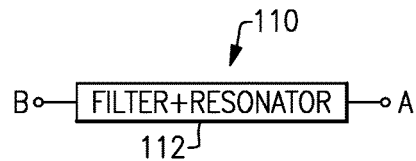
FIG. 1 depicts a radio-frequency (RF) signal path having a hybrid circuit between first and second nodes.

FIG. 1 depicts a radio-frequency (RF) signal path 110 having a hybrid circuit 112 between first and second nodes A and B. As described herein, such a hybrid circuit 112 can include a combination of one or more filters and one or more resonators such as surface acoustic wave (SAW) resonators. For the purpose of description, the hybrid circuit 112 can be referred to as a filter/resonator assembly, a filter/SAW assembly, and the like. As described herein, a plurality of such hybrid circuits can be implemented to form a multiplexer.

Figure 2:
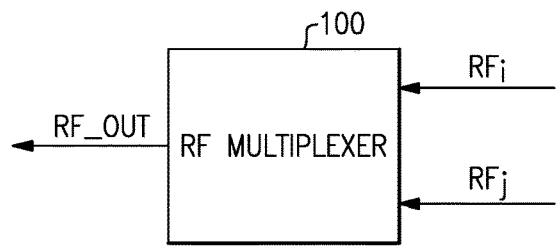
FIG. 2 depicts an RF multiplexer that can include one or more of the hybrid circuits of FIG. 1.

FIG. 2 depicts an RF multiplexer 100 that can include one or more of the hybrid circuits 112 of FIG. 1. Such an RF multiplexer can be configured to combine a plurality of signal paths, including those associated with a first signal $RF_i$ and a second signal $RF_j$, into a common path RF_OUT. For the purpose of description, a signal path and a corresponding signal may be used interchangeably. For example, $RF_i$ may be used to refer to the first signal and/or to the path associated with that signal, depending on context.

Although various examples are described herein in the foregoing context where a plurality of signals are merged or combined into a common path by the multiplexer 100, it will be understood that in some embodiments, a multiplexer having one or more features as described herein can also be configured to operate in reverse. For example, a common RF signal can be split into a plurality of signals, and such a configuration can benefit from one or more features as described herein.

Figure 3A:
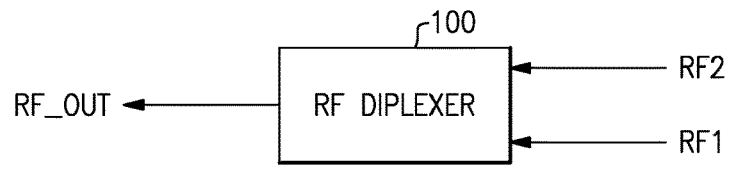
FIG. 3A shows that in some embodiments, the multiplexer of FIG. 2 can be a diplexer.
Figure 3B:
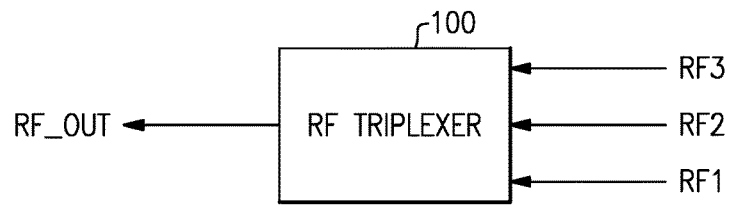
FIG. 3B shows that in some embodiments, the multiplexer of FIG. 2 can be a triplexer.
Figure 3C:
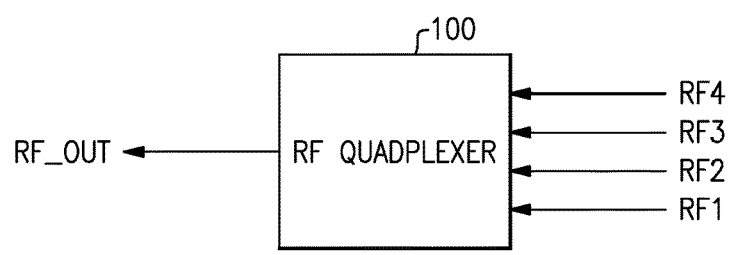
FIG. 3C shows that in some embodiments, the multiplexer of FIG. 2 can be a quadplexer.

For the purpose of description, it will be understood that multiplexer or multiplexing can involve combining of two or more signal paths into a common signal path. For example, FIG. 3A shows that a multiplexer can be a diplexer 100 configured to combine two signal paths RF1, RF2 into a common signal path RF_OUT. FIG. 3B shows that a multiplexer can be a triplexer 100 configured to combine three signal paths RF1, RF2, RF3 into a common signal path RF_OUT. FIG. 3C shows that a multiplexer can be a quadplexer 100 configured to combine four signal paths RF1, RF2, RF3, RF4 into a common signal path RF_OUT. Other numbers of signal paths can also be configured to be combined into a common signal path.

FIGS. 4-13 show various examples in which multiplexers are triplexers. However, it will be understood that one or more features of the present disclosure can also be implemented in other types of multiplexers.

Figure 4:
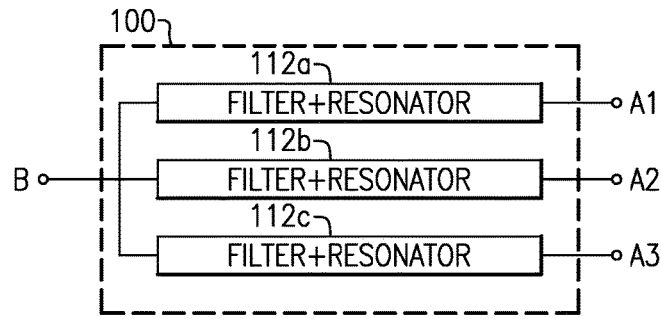
FIG. 4 shows an example of a triplexer having three signal paths that couple respective nodes to a common node.

FIG. 4 shows an example of a triplexer 100 having three signal paths that couple respective nodes A1, A2, A3 to a common node B. Each signal path is shown to include a hybrid circuit that includes a filter and a resonator. For example, the first signal path is shown to include a first hybrid circuit 112a having a filter and a resonator. Similarly, each of the second and third signal paths 112b, 112c is shown to include a filter and a resonator.

In the example of FIG. 4, all three signal paths of the triplexer 100 are depicted as having their respective hybrid circuits (112a, 112b, 112c). However, and as described herein, a multiplexer does not necessarily need to have hybrid circuits for all of its signal paths.

Figure 5A:
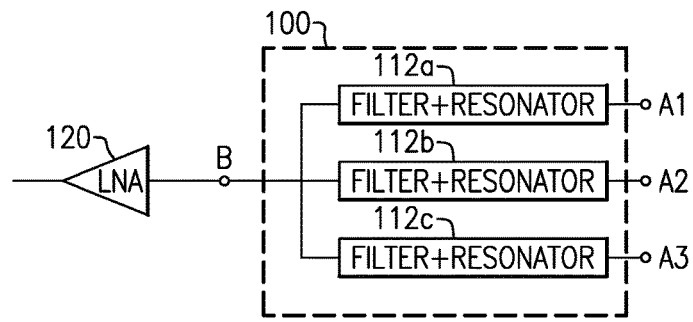
FIG. 5A shows that in some embodiments, a triplexer similar to the example of FIG. 4 can be implemented such that the common node is coupled to an input of a low-noise amplifier (LNA).
Figure 5B:
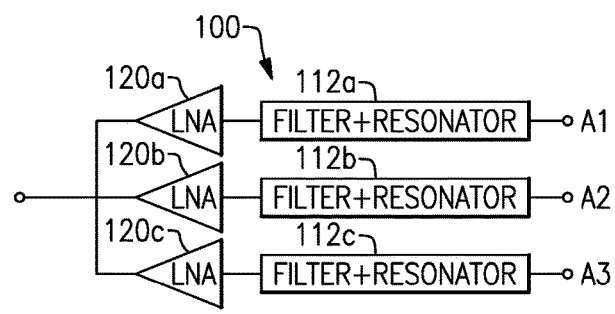
FIG. 5B shows that in some embodiments, a triplexer configuration can be implemented such that an output of each of the three hybrid circuits is coupled to an input of a corresponding LNA.
Figure 5C:
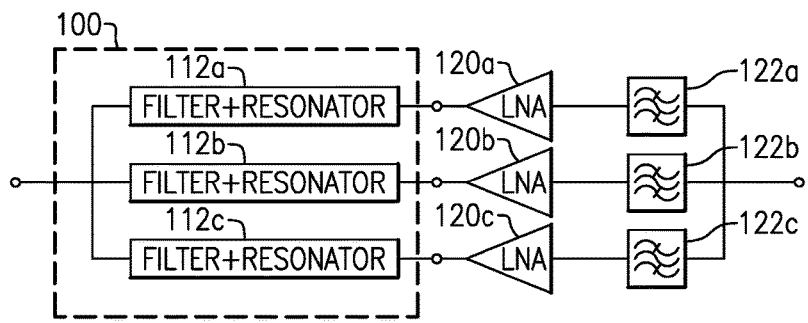
FIG. 5C shows that in some embodiments, a triplexer configuration can be implemented such that an input node of each of the three hybrid circuits can be coupled to an output of a corresponding LNA.

FIGS. 5A-5C show non-limiting examples where triplexers having one or more features as described herein can be implemented in downlink applications. It will be understood that one or more features of the present disclosure can also be implemented in uplink applications. Such uplink applications can include, for example, routing of RF signals associated with one or more power amplifiers (PAs).

FIG. 5A shows that in some embodiments, a triplexer 100 similar to the example of FIG. 4 can be implemented such that the common node B is coupled to an input of a low-noise amplifier (LNA) 120. Such an LNA can be, for example, a broadband LNA configured to amplify received RF signals in different bands as processed by the three hybrid circuits 112a, 112b, 112c.

FIG. 5B shows that in some embodiments, a triplexer configuration 100 can be implemented such that an output of each of the three hybrid circuits is coupled to an input of a corresponding LNA. Thus, an output of the first hybrid circuit 112a is shown to be coupled to an input of a first LNA 120a. Similarly, outputs of the second and third hybrid circuits 112b, 112c are shown to be coupled to respective inputs of second and third LNAs 120b, 120c. In some embodiments, each of the three LNAs 120a, 120b, 120c can be a narrowband LNA.

FIG. 5C shows that in some embodiments, a triplexer configuration 100 can be implemented such that an input node of each of the three hybrid circuits can be coupled to an output of a corresponding LNA. Thus, an input of the first hybrid circuit 112a is shown to be coupled to an output of a first LNA 120a. Similarly, inputs of the second and third hybrid circuits 112b, 112c are shown to be coupled to respective outputs of second and third LNAs 120b, 120c.

In the example of FIG. 5C, inputs of the LNAs 120a, 120b, 120c can be coupled to a common input node through their respective upstream filters 122a, 122b, 122c. Also in FIG. 5C, the outputs of the hybrid circuits 112a, 112b, 112c can be coupled to a common node.

It will be understood that triplexers having one or more features as described herein can also be implemented in other configurations.

Figure 6:
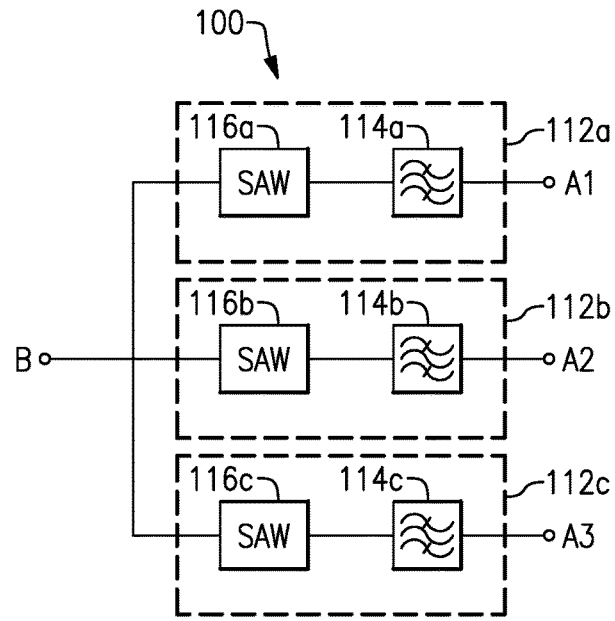
FIG. 6 shows an example triplexer configuration where a hybrid circuit can include a band-pass filter and a surface acoustic wave (SAW) resonator arranged such that the SAW resonator is implemented downstream of the corresponding band-pass filter.
Figure 7:
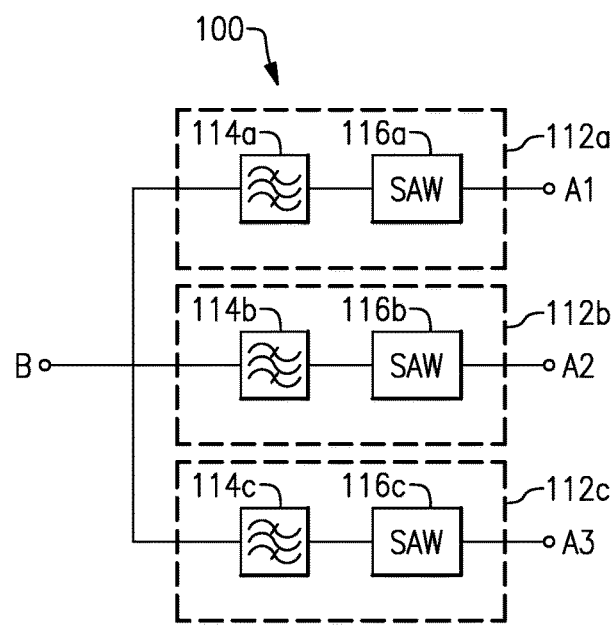
FIG. 7 shows an example triplexer configuration where a hybrid circuit can include a band-pass filter and a surface acoustic wave (SAW) resonator arranged such that the SAW resonator is implemented upstream of the corresponding band-pass filter.
Figure 8:
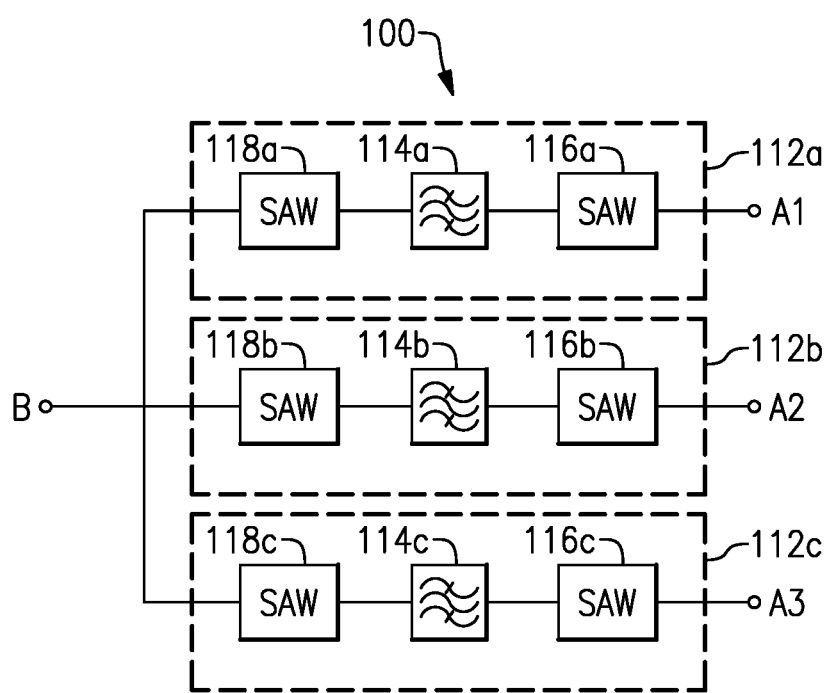
FIG. 8 shows an example triplexer configuration where a hybrid circuit can include a band-pass filter and first and second surface acoustic wave (SAW) resonators arranged such that the band-pass filter is between the corresponding first and second SAW resonators.

FIGS. 6-8 show examples where a hybrid circuit can include a band-pass filter and a surface acoustic wave (SAW) resonator. In the example of FIG. 6, a triplexer 100 is shown to include three hybrid circuits 112a, 112b, 112c that couple their respective input nodes A1, A2, A3 to a common node B. Each of the three hybrid circuits 112a, 112b, 112c is shown to be configured such that a SAW resonator is implemented downstream of the corresponding band-pass filter. Accordingly, a SAW resonator 116a is shown to be downstream of a band-pass filter 114a in the first hybrid circuit 112a. Similarly, in the second and third hybrid circuits 112b, 112c, SAW resonators 116b, 116c are shown to be downstream of their respective band-pass filters 114b, 114c.

In the example of FIG. 7, a triplexer 100 is shown to include three hybrid circuits 112a, 112b, 112c that couple their respective input nodes A1, A2, A3 to a common node B. Each of the three hybrid circuits 112a, 112b, 112c is shown to be configured such that a SAW resonator is implemented upstream of the corresponding band-pass filter. Accordingly, a SAW resonator 116a is shown to be upstream of a band-pass filter 114a in the first hybrid circuit 112a. Similarly, in the second and third hybrid circuits 112b, 112c, SAW resonators 116b, 116c are shown to be upstream of their respective band-pass filters 114b, 114c.

In the example of FIG. 8, a triplexer 100 is shown to include three hybrid circuits 112a, 112b, 112c that couple their respective input nodes A1, A2, A3 to a common node B. Each of the three hybrid circuits 112a, 112b, 112c is shown to be configured such that a first SAW resonator is implemented upstream of the corresponding band-pass filter, and a second SAW resonator is implemented downstream of the same band-pass filter. Accordingly, a SAW resonator 116a is shown to be upstream of a band-pass filter 114a, and a SAW resonator 118a is shown to be downstream of the band-pass filter 114a in the first hybrid circuit 112a. Similarly, in the second and third hybrid circuits 112b, 112c, SAW resonators 116b, 116c are shown to be upstream of their respective band-pass filters 114b, 114c, and SAW resonators 118b, 118c are shown to be downstream of the same band-pass filters 114b, 114c.

It will be understood that other combinations of one or more filters and one or more SAW resonators can be implemented for a given hybrid circuit. It will also be understood that for a given multiplexer, hybrid circuits may or may not be configured similarly among each other. For example, one hybrid circuit can have a SAW resonator upstream of a filter, while another hybrid circuit in the same multiplexer has a SAW resonator downstream of a filter. It will also be understood that not all of the signal paths in a multiplexer necessarily need to have hybrid circuits. For example, one or more signal paths in a given multiplexer can include respective hybrid circuit(s), while one or more signal paths in the same multiplexer does/do not have such hybrid circuit functionality.

Figure 9A:
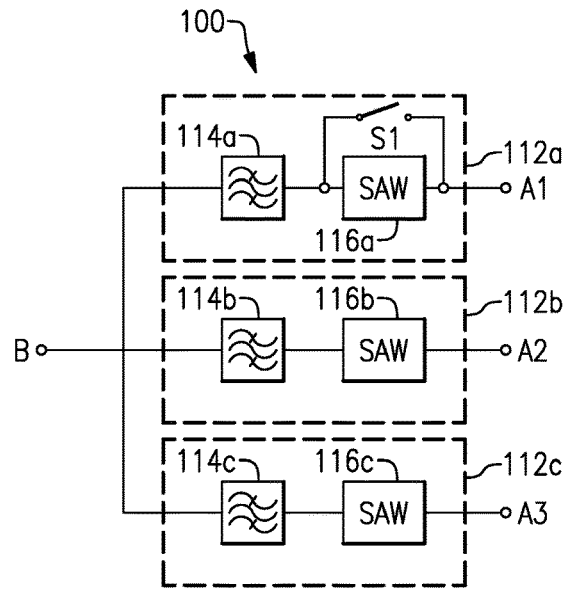
FIG. 9A shows that in some embodiments, at least one hybrid circuit of a multiplexer can include a resonator-bypass functionality.
Figure 9B:
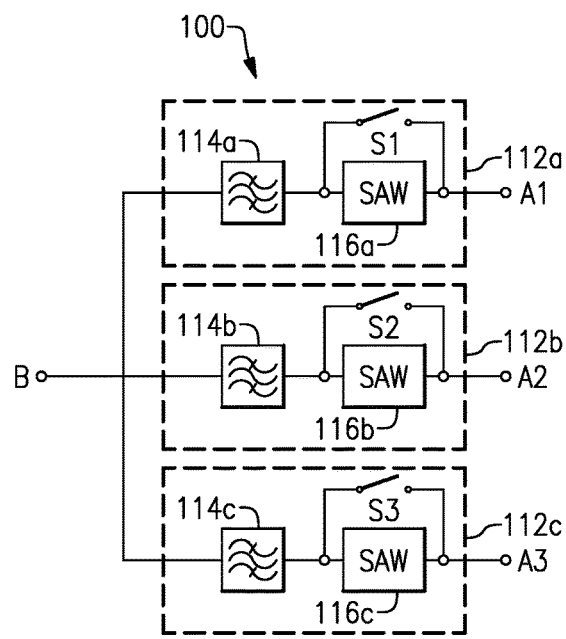
FIG. 9B shows that in some embodiments, each hybrid circuit of a multiplexer can include a resonator-bypass functionality.

FIGS. 9A and 9B show that in some embodiments, some or all of one or more hybrid circuits in a multiplexer can include a functionality where corresponding resonator(s) can be implemented in a switchable manner. For the purpose of description, the examples of FIGS. 9A and 9B are in the context of a triplexer having three hybrid circuits, and each hybrid circuit is assumed to include a band-pass filter and a SAW resonator. However, it will be understood that as described herein, other configurations of hybrid circuits can also utilize one or more switches, and that such switchable resonator functionality can be implemented in other types of multiplexers.

In the example of FIG. 9A, three hybrid circuits 112a, 112b, 112c are arranged similarly to the example of FIG. 7 in terms of their respective band-pass filters and SAW resonators. However, one of the three hybrid circuits (e.g., the hybrid circuit 112a) is shown to include a switch S1 implemented parallel with the SAW resonator 116a. Accordingly, when the band-pass filter plus SAW resonator functionality is desired for the hybrid circuit 112a, the switch S1 can be opened. If such band-pass filter plus SAW resonator functionality is not needed or desired, the switch S1 can be closed such that the SAW resonator 116a is substantially bypassed by an RF signal.

In the example of FIG. 9B, three hybrid circuits 112a, 112b, 112c are also arranged similarly to the example of FIG. 7 in terms of their respective band-pass filters and SAW resonators. However, each of the three hybrid circuits is shown to include a switch implemented parallel with the corresponding SAW resonator. Accordingly, when the band-pass filter plus SAW resonator functionality is desired for the hybrid circuit 112a, the switch S1 can be opened. If such band-pass filter plus SAW resonator functionality is not needed or desired, the switch S1 can be closed such that the SAW resonator 116a is substantially bypassed by an RF signal. Similarly, when the band-pass filter plus SAW resonator functionality is desired for the hybrid circuit 112b, the switch S2 can be opened. If such band-pass filter plus SAW resonator functionality is not needed or desired, the switch S2 can be closed such that the SAW resonator 116b is substantially bypassed by an RF signal. Similarly, when the band-pass filter plus SAW resonator functionality is desired for the hybrid circuit 112c, the switch S3 can be opened. If such band-pass filter plus SAW resonator functionality is not needed or desired, the switch S3 can be closed such that the SAW resonator 116c is substantially bypassed by an RF signal.

Figure 10:
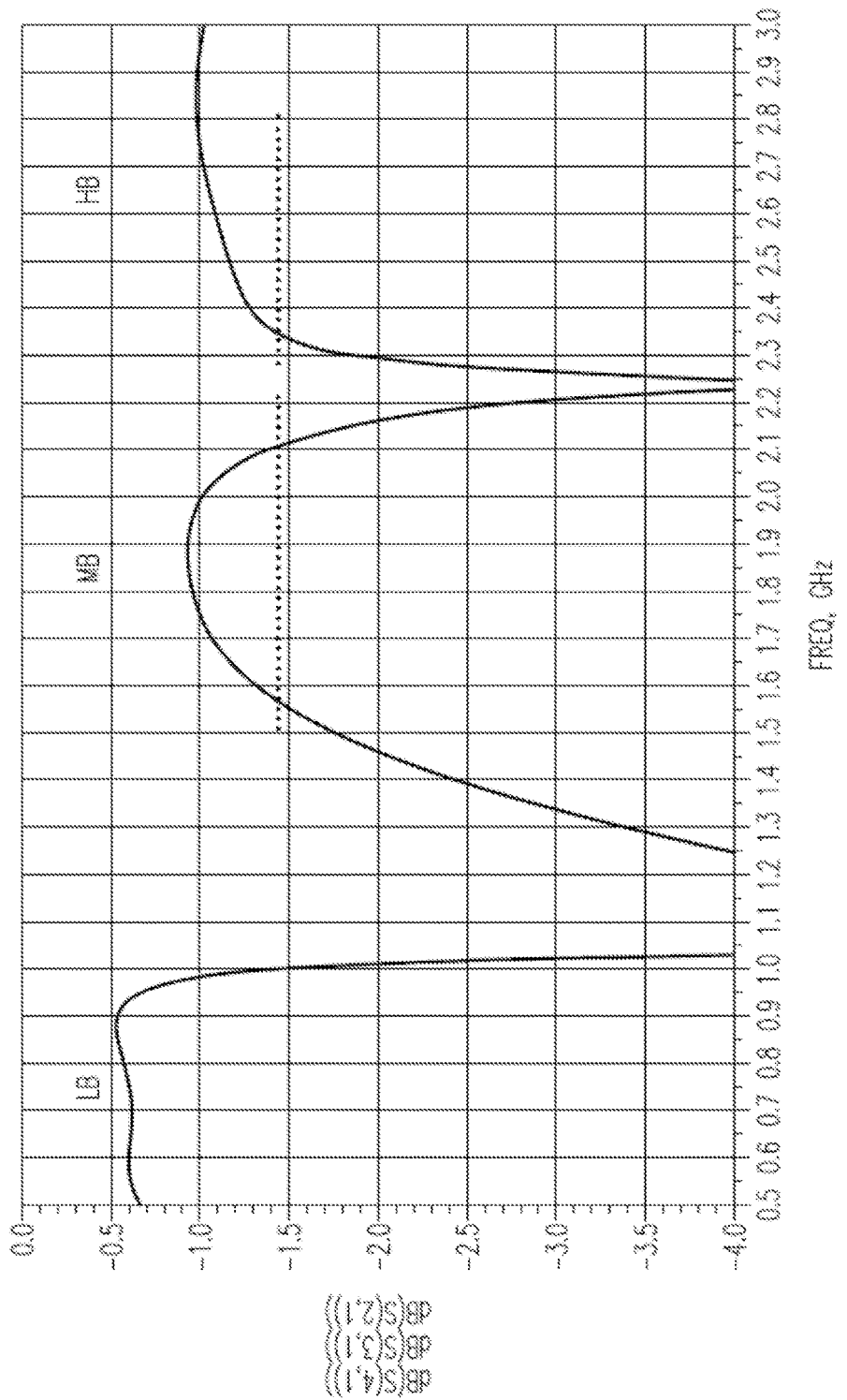
FIG. 10 shows insertion loss plots for a conventional triplexer where each of the three signal paths only has a band-pass filter.

FIG. 10 shows insertion loss plots for a conventional triplexer where each of the three signal paths only has a band-pass filter. The band-pass filter of the first signal path is configured as a low-band (LB) filter, the band-pass filter of the second signal path is configured as a mid-band (MB) filter, and the band-pass filter of the third signal path is configured as a high-band (HB) filter. Accordingly, the three insertion loss plots are indicated as LB (left), MB (middle), and HB (right) in FIG. 10.

Figure 11:
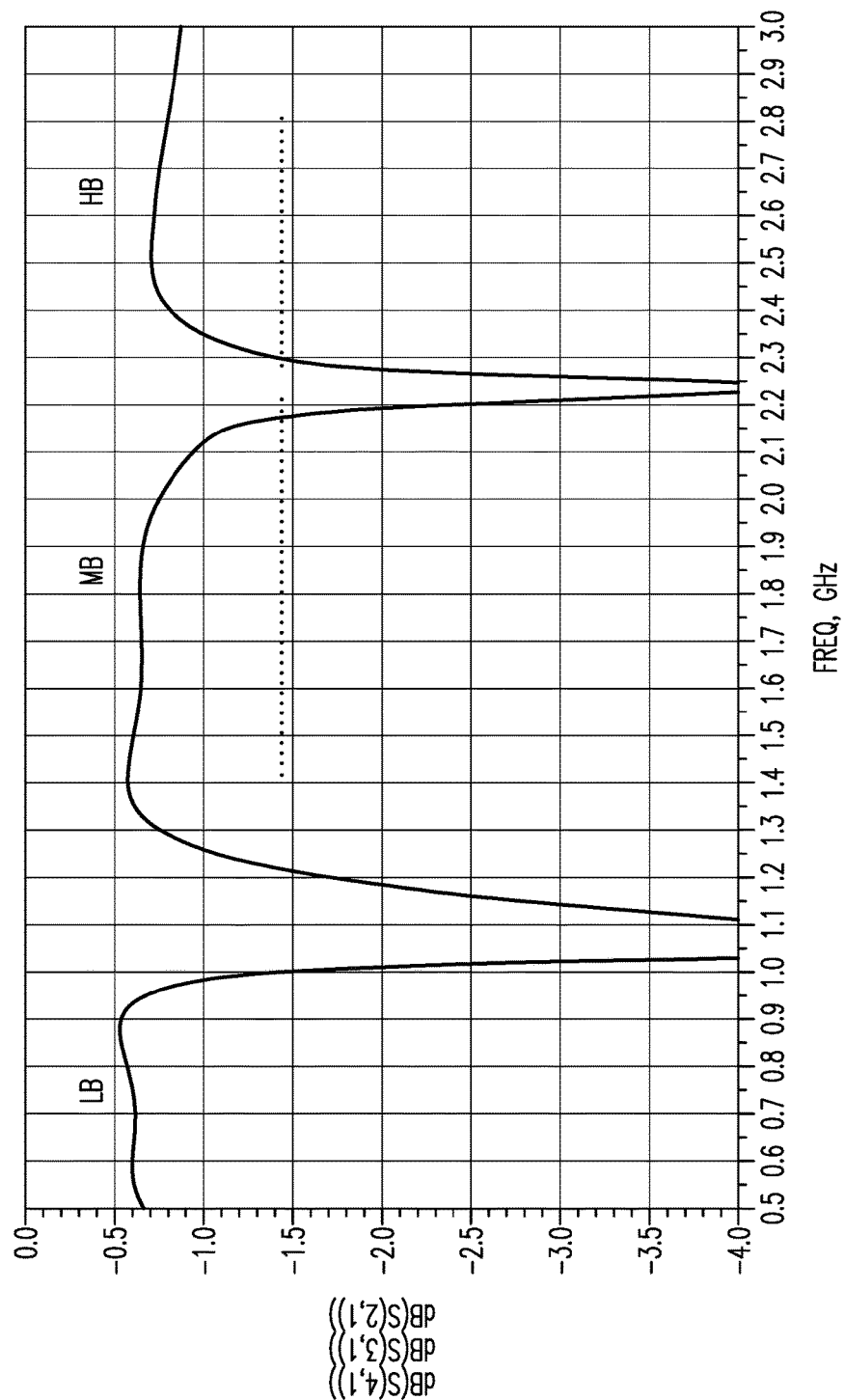
FIG. 11 shows insertion loss plots for the same frequency ranges as in FIG. 10, for a triplexer in which a low-band signal path that only has a band-pass filter; and each of mid-band and high-band signal paths includes a hybrid circuit similar to the example of FIG. 7.

FIG. 11 shows insertion loss plots for the same LB, MB and HB frequency ranges as in FIG. 10. In the example of FIG. 11, a triplexer includes a LB signal path that only has a band-pass filter; and each of MB and HB signal paths includes a hybrid circuit similar to the example of FIG. 7 (where a SAW resonator is implemented upstream of a band-pass filter). In FIG. 11, the three insertion loss plots resulting from such a configuration are indicated as LB (left), MB (middle), and HB (right).

In each of FIGS. 10 and 11, an example reference insertion loss level is indicated at approximately 1.5 dB. As for the insertion loss plots in the LB range, they are generally the same in FIGS. 10 and 11 as expected, since the LB paths in both triplexers are configured the same.

As for the MB and HB results, one can see that the triplexer corresponding to FIG. 11 has significantly better insertion loss performance than the triplexer corresponding to FIG. 10. Further, band definitions in FIG. 11 are significantly better than the counterparts in FIG. 10. For example, the upper edge of MB and the close lower edge of HB are better separated and defined in FIG. 11 than in FIG. 10.

Figure 12:
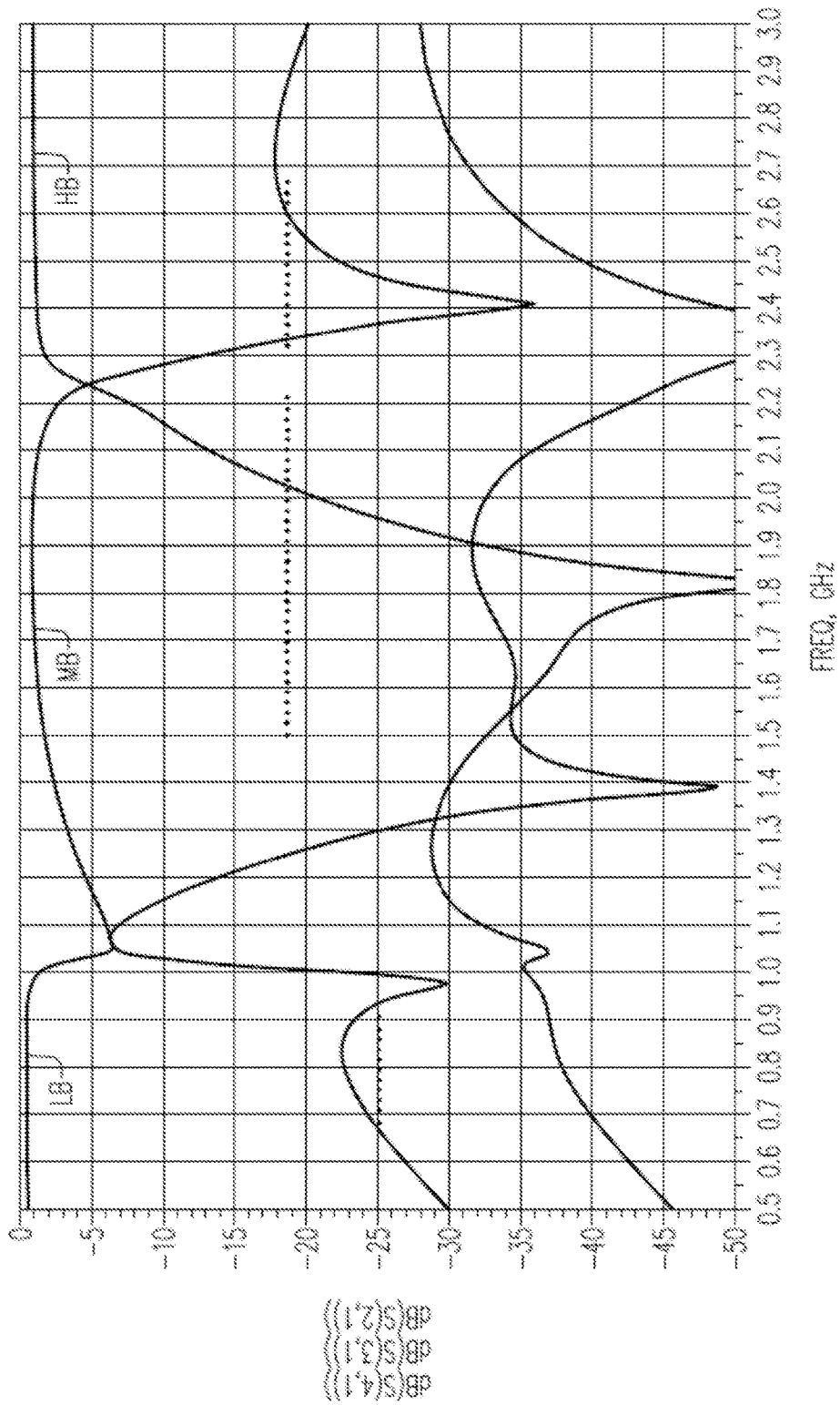
FIG. 12 shows isolation plots for the conventional triplexer configuration of FIG. 10.
Figure 13:
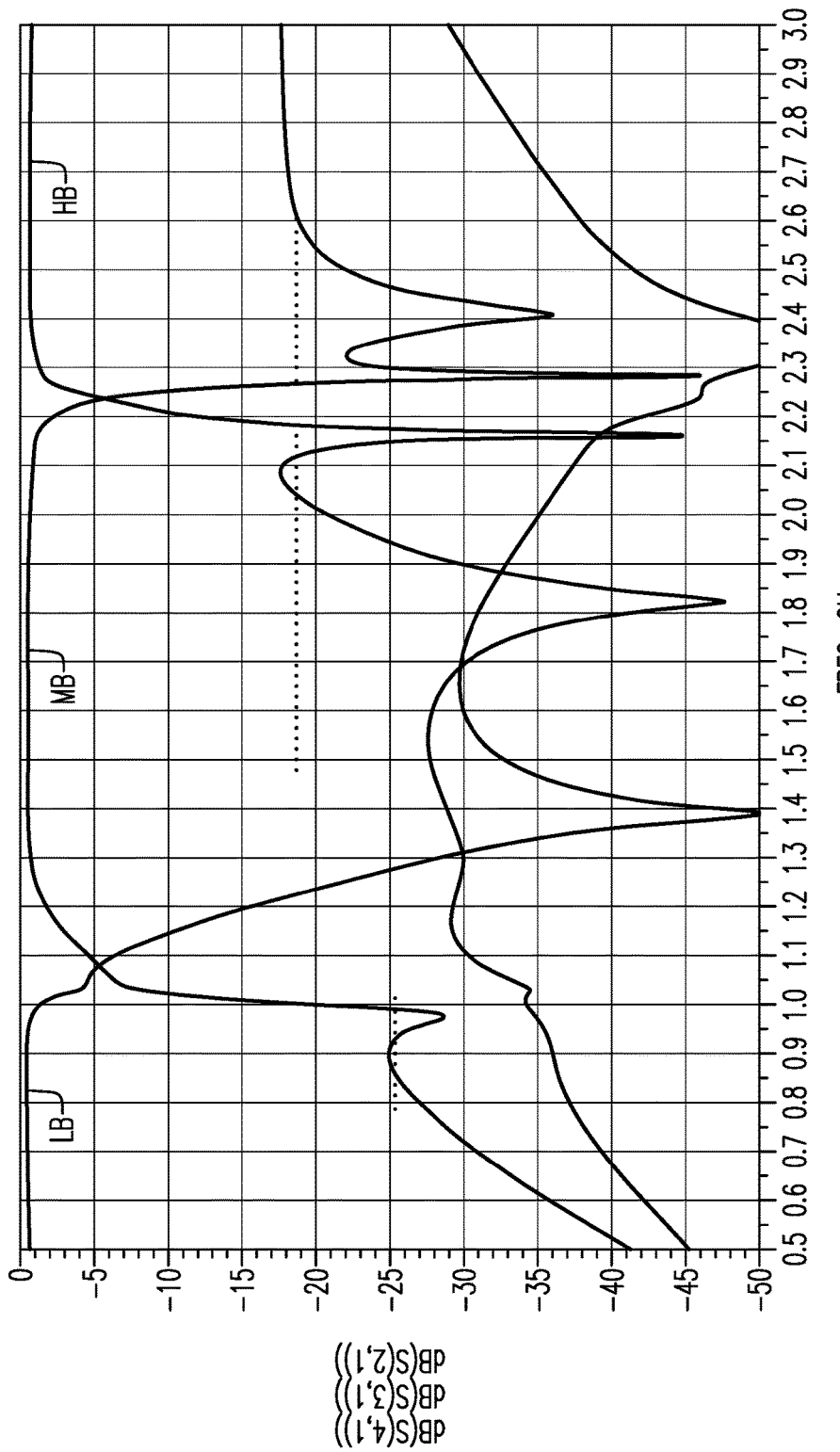
FIG. 13 shows isolation plots for the triplexer configuration of FIG. 11.

FIG. 12 shows isolation plots for the conventional triplexer configuration of FIG. 10, for the same LB, MB and HB frequency ranges. FIG. 13 shows isolation plots for the triplexer configuration of FIG. 11, for the same LB, MB and HB frequency ranges. Referring to FIGS. 12 and 13, an example reference isolation level is indicated for each of the three example bands. One can see that the triplexer corresponding to FIG. 13 has improved isolation performance when compared to the triplexer corresponding to FIG. 12.

In the various examples described herein, it will be understood that a filter such as a band-pass filter can be, for example, lumped components based, transmission-line based, cavity based, or any combination thereof. It will also be understood that while various resonators are described in the context of SAW resonators, other types of resonators can also be utilized. For example, resonators such as bulk acoustic wave (BAW) resonators or thin-film bulk acoustic resonators (FBAR or TFBAR) can be utilized. In another example, resonator devices and/or circuits (acoustic wave based or not) having high Q-factors can also be utilized. In some embodiments, a resonator (SAW or otherwise) as described herein can have a higher Q-factor value than a corresponding filter.

Examples of Wireless Applications:

Among others, a multiplexer having one or more features as described herein can be utilized in multi-band carrier aggregation (CA) associated with, for example, LTE (Long-Term Evolution) communication technology. In such an application, relatively narrow frequency spacing between some of aggregated bands can result in challenges in meeting isolation and insertion loss performance levels. To address such challenges, special filters can be implemented. However, such special filters are typically costly, and can also introduce excessive losses to signals being processed.

In some embodiments, a multiplexer such as a triplexer having one or more features as described herein can be implemented in a front-end module (FEM). Such a front-end module can reduce or eliminate the need for the foregoing special filters to facilitate the multi-band CA functionality with acceptable performance levels. Multiplexers having one or more features as described herein can provide, for example, better defined notches (e.g., including sharper roll-off) to thereby provide improved isolation between adjacent frequency bands. As also described herein, lower pass band insertion loss can also be realized with a multiplexer having one or more hybrid circuits.

Figure 14:
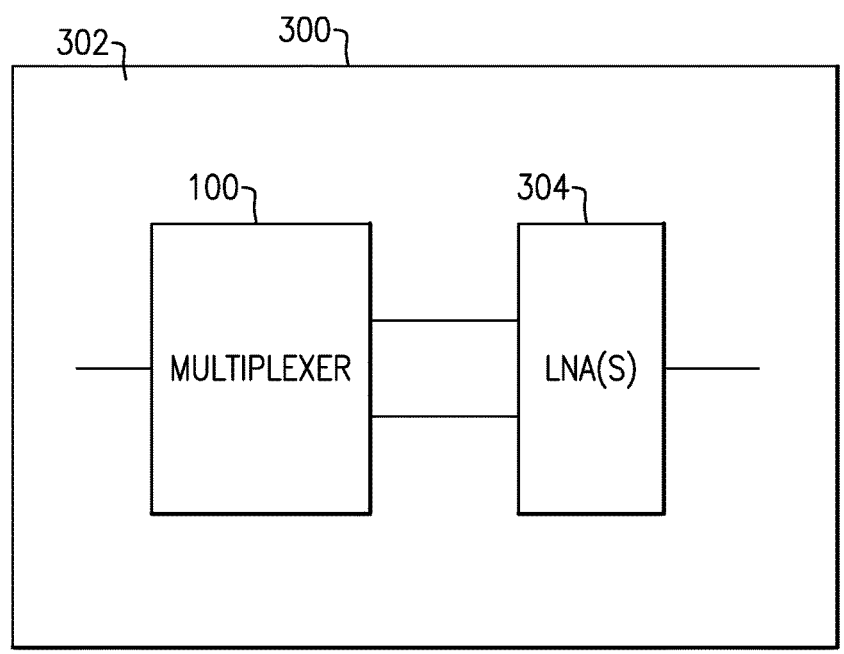
FIG. 14 shows that in some embodiments, a multiplexer having one or more features as described herein can be implemented in a module.

Examples of Products Having One or More Features as Described Herein:

FIG. 14 shows that in some embodiments, a multiplexer having one or more features as described herein can be implemented in a module 300. Such a module can be, for example, a front-end module described above. In some embodiments, such a module can include a packaging substrate 302 such as a laminate substrate or a ceramic substrate. The module 300 can include one or more LNAs 304 implemented on the packaging substrate 302. The module 300 can further include a multiplexer 100 having one or more features as described herein.

In some embodiments, the module of FIG. 14 can be configured as a diversity receive (DRx) module. An example of how such a DRx module can be implemented in a wireless device is described herein.

In some embodiments, a multiplexer having one or more features as described herein can be implemented in a module that may or may not include LNA(s), but in which filtering functionality is utilized. Such a module can include, for example, a power amplifier (PA) module or any module in which a plurality of RF signal paths are configured for different frequency bands.

In some implementations, an architecture, device and/or circuit having one or more features described herein can be included in an RF device such as a wireless device. Such an architecture, device and/or circuit can be implemented directly in the wireless device, in one or more modular forms as described herein, or in some combination thereof. In some embodiments, such a wireless device can include, for example, a cellular phone, a smart-phone, a hand-held wireless device with or without phone functionality, a wireless tablet, a wireless router, a wireless access point, a wireless base station, etc. Although described in the context of wireless devices, it will be understood that one or more features of the present disclosure can also be implemented in other RF systems such as base stations.

Figure 15:
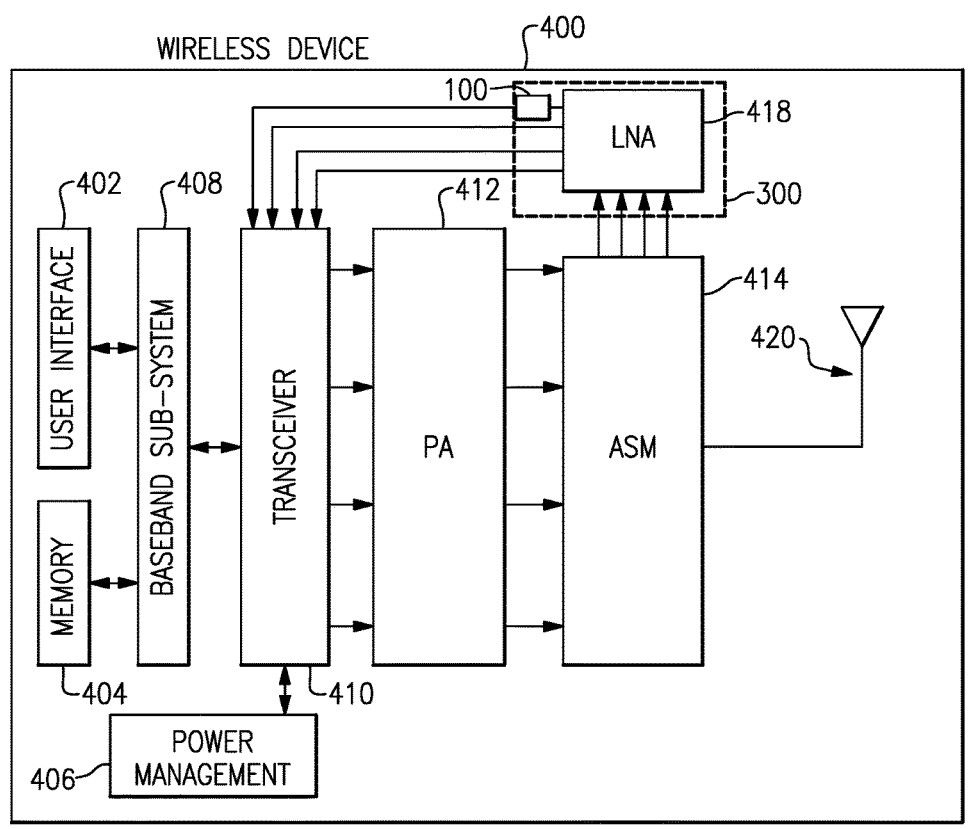
FIG. 15 depicts an example wireless device having one or more advantageous features described herein.

FIG. 15 depicts an example wireless device 400 having one or more advantageous features described herein. In some embodiments, such advantageous features can be implemented in a front-end (FE) module or an LNA module 300. In some embodiments, such a module can include more or less components than as indicated by the dashed box.

Power amplifiers (PAs) in a PA module 412 can receive their respective RF signals from a transceiver 410 that can be configured and operated to generate RF signals to be amplified and transmitted, and to process received signals. The transceiver 410 is shown to interact with a baseband sub-system 408 that is configured to provide conversion between data and/or voice signals suitable for a user and RF signals suitable for the transceiver 410. The transceiver 410 is also shown to be connected to a power management component 406 that is configured to manage power for the operation of the wireless device 400. Such power management can also control operations of the baseband sub-system 408 and other components of the wireless device 400.

The baseband sub-system 408 is shown to be connected to a user interface 402 to facilitate various input and output of voice and/or data provided to and received from the user. The baseband sub-system 408 can also be connected to a memory 404 that is configured to store data and/or instructions to facilitate the operation of the wireless device, and/or to provide storage of information for the user.

In the example wireless device 400, the module 300 can include a multiplexer 100 configured to provide one or more functionalities as described herein. Such a multiplexer can facilitate processing of signals received through an antenna 420 and an antenna switch module (ASM) 414. Amplified and multiplexed signals from the multiplexer 100 are shown to be routed to the transceiver 410.

Figure 16:
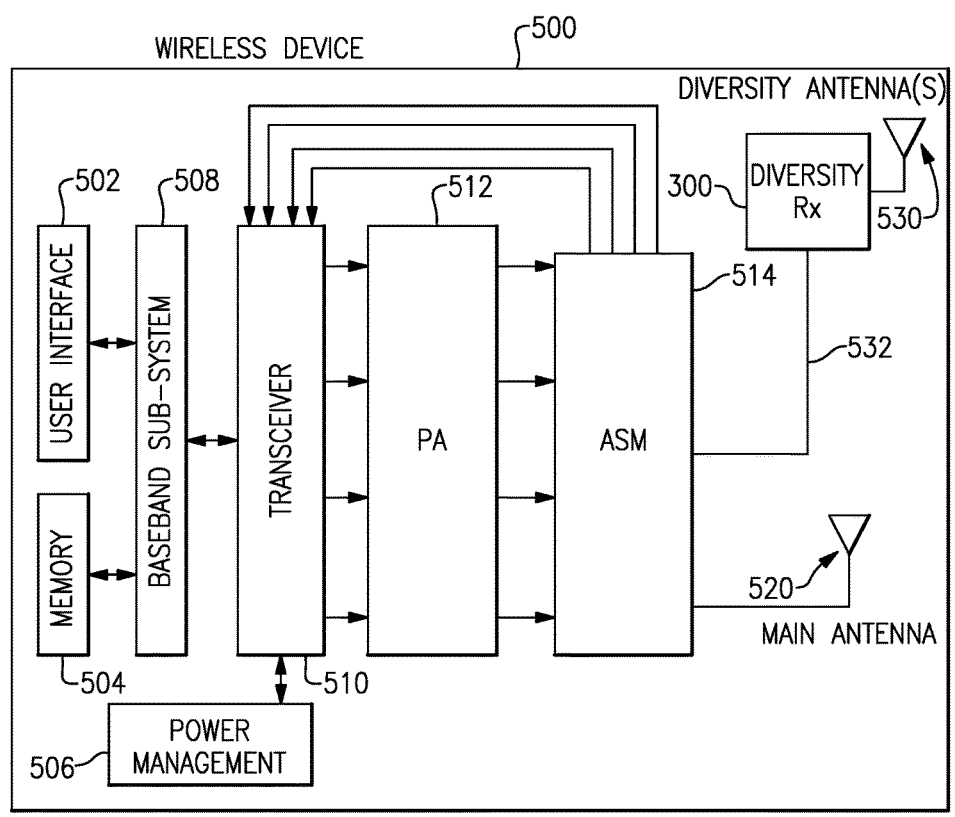
FIG. 16 depicts another example wireless device having one or more advantageous features described herein.

FIG. 16 shows another example of a wireless device 500 in which one or more features of the present disclosure can be implemented in a diversity receive (DRx) module 300. In such a wireless device, components such as user interface 502, memory 504, power management 506, baseband sub-system 508, transceiver 510, power amplifier (PA) 512, antenna switch module (ASM) 514, and antenna 520 can be generally similar to the examples of FIG. 15.

In some embodiments, the DRx module 300 can be implemented between one or more diversity antennas (e.g., diversity antenna 530) and the ASM 514. Such a configuration can allow an RF signal received through the diversity antenna 530 to be processed (in some embodiments, including amplification by an LNA) with little or no loss of and/or little or no addition of noise to the RF signal from the diversity antenna 530. Such processed signal from the DRx module 300 can then be routed to the ASM through one or more signal paths 532 which can be relatively lossy.

In the example of FIG. 16, the RF signal from the DRx module 300 can be routed through the ASM 514 to the transceiver 510 through one or more receive (Rx) paths. Some or all of such Rx paths can include their respective LNA(s). In some embodiments, the RF signal from the DRx module 300 may or may not be further amplified with such LNA(s).

A number of other wireless device configurations can utilize one or more features described herein. For example, a wireless device does not need to be a multi-band device. In another example, a wireless device can include additional antennas such as diversity antenna, and additional connectivity features such as Wi-Fi, Bluetooth, and GPS.

One or more features of the present disclosure can be implemented with various cellular frequency bands as described herein. Examples of such bands are listed in Table 1. It will be understood that at least some of the bands can be divided into sub-bands. It will also be understood that one or more features of the present disclosure can be implemented with frequency ranges that do not have designations such as the examples of Table 1.

TABLE 1

| Band | Mode | Tx Frequency Range (MHz) | Rx Frequency Range (MHz) |
| --- | --- | --- | --- |
| B1 | FDD | 1,920-1,980 | 2,110-2,170 |
| B2 | FDD | 1,850-1,910 | 1,930-1,990 |
| B3 | FDD | 1,710-1,785 | 1,805-1,880 |
| B4 | FDD | 1,710-1,755 | 2,110-2,155 |
| B5 | FDD | 824-849 | 869-894 |
| B6 | FDD | 830-840 | 875-885 |
| B7 | FDD | 2,500-2,570 | 2,620-2,690 |
| B8 | FDD | 880-915 | 925-960 |
| B9 | FDD | 1,749.9-1,784.9 | 1,844.9-1,879.9 |
| B10 | FDD | 1,710-1,770 | 2,110-2,170 |
| B11 | FDD | 1,427.9-1,447.9 | 1,475.9-1,495.9 |
| B12 | FDD | 699-716 | 729-746 |
| B13 | FDD | 777-787 | 746-756 |
| B14 | FDD | 788-798 | 758-768 |
| B15 | FDD | 1,900-1,920 | 2,600-2,620 |
| B16 | FDD | 2,010-2,025 | 2,585-2,600 |
| B17 | FDD | 704-716 | 734-746 |
| B18 | FDD | 815-830 | 860-875 |
| B19 | FDD | 830-845 | 875-890 |
| B20 | FDD | 832-862 | 791-821 |
| B21 | FDD | 1,447.9-1,462.9 | 1,495.9-1,510.9 |
| B22 | FDD | 3,410-3,490 | 3,510-3,590 |
| B23 | FDD | 2,000-2,020 | 2,180-2,200 |
| B24 | FDD | 1,626.5-1,660.5 | 1,525-1,559 |
| B25 | FDD | 1,850-1,915 | 1,930-1,995 |
| B26 | FDD | 814-849 | 859-894 |
| B27 | FDD | 807-824 | 852-869 |
| B28 | FDD | 703-748 | 758-803 |
| B29 | FDD | N/A | 716-728 |
| B30 | FDD | 2,305-2,315 | 2,350-2,360 |
| B31 | FDD | 452.5-457.5 | 462.5-467.5 |
| B33 | TDD | 1,900-1,920 | 1,900-1,920 |
| B34 | TDD | 2,010-2,025 | 2,010-2,025 |
| B35 | TDD | 1,850-1,910 | 1,850-1,910 |
| B36 | TDD | 1,930-1,990 | 1,930-1,990 |
| B37 | TDD | 1,910-1,930 | 1,910-1,930 |
| B38 | TDD | 2,570-2,620 | 2,570-2,620 |
| B39 | TDD | 1,880-1,920 | 1,880-1,920 |
| B40 | TDD | 2,300-2,400 | 2,300-2,400 |
| B41 | TDD | 2,496-2,690 | 2,496-2,690 |
| B42 | TDD | 3,400-3,600 | 3,400-3,600 |
| B43 | TDD | 3,600-3,800 | 3,600-3,800 |
| B44 | TDD | 703-803 | 703-803 |

General Comments:

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively. The word "or" in reference to a list of two or more items, that word covers all of the following interpretations of the word: any of the items in the list, all of the items in the list, and any combination of the items in the list.

The above detailed description of embodiments of the invention is not intended to be exhaustive or to limit the invention to the precise form disclosed above. While specific embodiments of, and examples for, the invention are described above for illustrative purposes, various equivalent modifications are possible within the scope of the invention, as those skilled in the relevant art will recognize. For example, while processes or blocks are presented in a given order, alternative embodiments may perform routines having steps, or employ systems having blocks, in a different order, and some processes or blocks may be deleted, moved, added, subdivided, combined, and/or modified. Each of these processes or blocks may be implemented in a variety of different ways. Also, while processes or blocks are at times shown as being performed in series, these processes or blocks may instead be performed in parallel, or may be performed at different times.

The teachings of the invention provided herein can be applied to other systems, not necessarily the system described above. The elements and acts of the various embodiments described above can be combined to provide further embodiments.

While some embodiments of the inventions have been described, these embodiments have been presented by way of example only, and are not intended to limit the scope of the disclosure. Indeed, the novel methods and systems described herein may be embodied in a variety of other forms; furthermore, various omissions, substitutions and changes in the form of the methods and systems described herein may be made without departing from the spirit of the disclosure. The accompanying claims and their equivalents are intended to cover such forms or modifications as would fall within the scope and spirit of the disclosure.

What is claimed is:

1. A multiplexer for processing radio-frequency signals, comprising:
    a plurality of nodes;
    a common node; and
    a signal path implemented between each of the plurality of nodes and the common node, each corresponding signal path including a filter and a respective resonator, the plurality of corresponding signal paths configured to support carrier aggregation of respective signals through the common node.

2. The multiplexer of claim 1 wherein each corresponding signal path provides a sharper notch profile for the respective signal than each corresponding signal path would provide without the respective resonator.

3. The multiplexer of claim 2 wherein the plurality of nodes correspond to a plurality of respective input nodes, and the common node corresponds to an output node.

4. The multiplexer of claim 3 wherein the multiplexer is a diplexer such that two input nodes are coupled to the common output node through their corresponding signal paths.

5. The multiplexer of claim 3 wherein the multiplexer is a triplexer such that three input nodes are coupled to the common output node through their corresponding signal paths.

6. The multiplexer of claim 3 wherein the multiplexer is a quadplexer such that four input nodes are coupled to the common output node through their corresponding signal paths.

7. The multiplexer of claim 3 further comprising an additional signal path implemented between an additional input node and the common output node, and having a filter but not a resonator.

8. The multiplexer of claim 7 wherein the corresponding signal paths having the respective resonators are configured to process signals having frequencies that are higher than a frequency range associated with the additional signal path.

9. The multiplexer of claim 3 wherein the respective resonator and the filter are connected in series in the corresponding signal path.

10. The multiplexer of claim 9 wherein the respective resonator is implemented upstream of the filter.

11. The multiplexer of claim 9 wherein the respective resonator is implemented downstream of the filter.

12. The multiplexer of claim 9 wherein the corresponding signal path further includes an additional respective resonator.

13. The multiplexer of claim 12 wherein the filter is implemented between the two respective resonators.

14. The multiplexer of claim 3 wherein each respective resonator has a Q-factor value that is higher than the corresponding filter's Q-factor value.

15. The multiplexer of claim 14 wherein each filter is a band-pass filter.

16. The multiplexer of claim 15 wherein each respective resonator is a surface acoustic wave resonator.

17. The multiplexer of claim 15 wherein each respective resonator is a bulk acoustic wave resonator or a resonator having a high Q-factor value.

18. A radio-frequency module comprising:
    a packaging substrate configured to receive a plurality of components; and
    a multiplexer implemented relative to the packaging substrate, the multiplexer including a plurality of nodes and a common node, and a signal path implemented between each of the plurality of nodes and the common node, each corresponding signal path including a filter and a respective resonator, the plurality of corresponding signal paths configured to support carrier aggregation of respective signals through the common node.

19. A wireless device comprising:
    a receiver;
    a radio-frequency module in communication with the receiver, the radio-frequency module including a multiplexer having a plurality of nodes and a common node, the multiplexer further including a signal path implemented between each of the plurality of nodes and the common node, each corresponding signal path including a filter and a respective resonator, the plurality of corresponding signal paths configured to support carrier aggregation of respective signals through the common node; and
    an antenna in communication with the radio-frequency module, and configured to receive the respective signals.

* * * * *